(12) United States Patent
Phua et al.

(10) Patent No.: US 8,034,670 B2
(45) Date of Patent: Oct. 11, 2011

(54) RELIABLE MEMORY CELL

(75) Inventors: Timothy Phua, Singapore (SG);
Bangun Indajang, Singapore (SG);
Dong Kyun Sohn, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 232 days.

(21) Appl. No.: 12/401,622

(22) Filed: Mar. 11, 2009

(65) Prior Publication Data

US 2010/0230744 A1  Sep. 16, 2010

(51) Int. Cl.
*H01L 21/335* (2006.01)
*H01L 29/76* (2006.01)

(52) U.S. Cl. ............ 438/142; 257/213; 257/E21.409; 257/E29.309

(58) Field of Classification Search .............. 257/325, 257/E21.423, E21.409, E29.309, 213, 250, 257/315; 438/287, 585, 267, 142, 151, 157
See application file for complete search history.

(56) References Cited

U.S. PATENT DOCUMENTS

| 6,133,098 A * | 10/2000 | Ogura et al. ............ 438/267 |
| 6,284,598 B1 * | 9/2001 | Kelley et al. ............ 438/257 |
| 6,429,054 B1 * | 8/2002 | Krishnan et al. ......... 438/149 |
| 2002/0098653 A1 * | 7/2002 | Flagan et al. ............ 438/260 |

* cited by examiner

*Primary Examiner* — Thomas L Dickey
*Assistant Examiner* — Nikolay Yushin
(74) *Attorney, Agent, or Firm* — Horizon IP Pte Ltd

(57) ABSTRACT

A method of forming a semiconductor device is presented. A substrate prepared with a second gate is provided. The second gate is processed to form a second gate with a rounded corner and a first gate is formed on the substrate. The first gate is adjacent to and overlaps a portion of the second gate and the rounded corner.

27 Claims, 9 Drawing Sheets

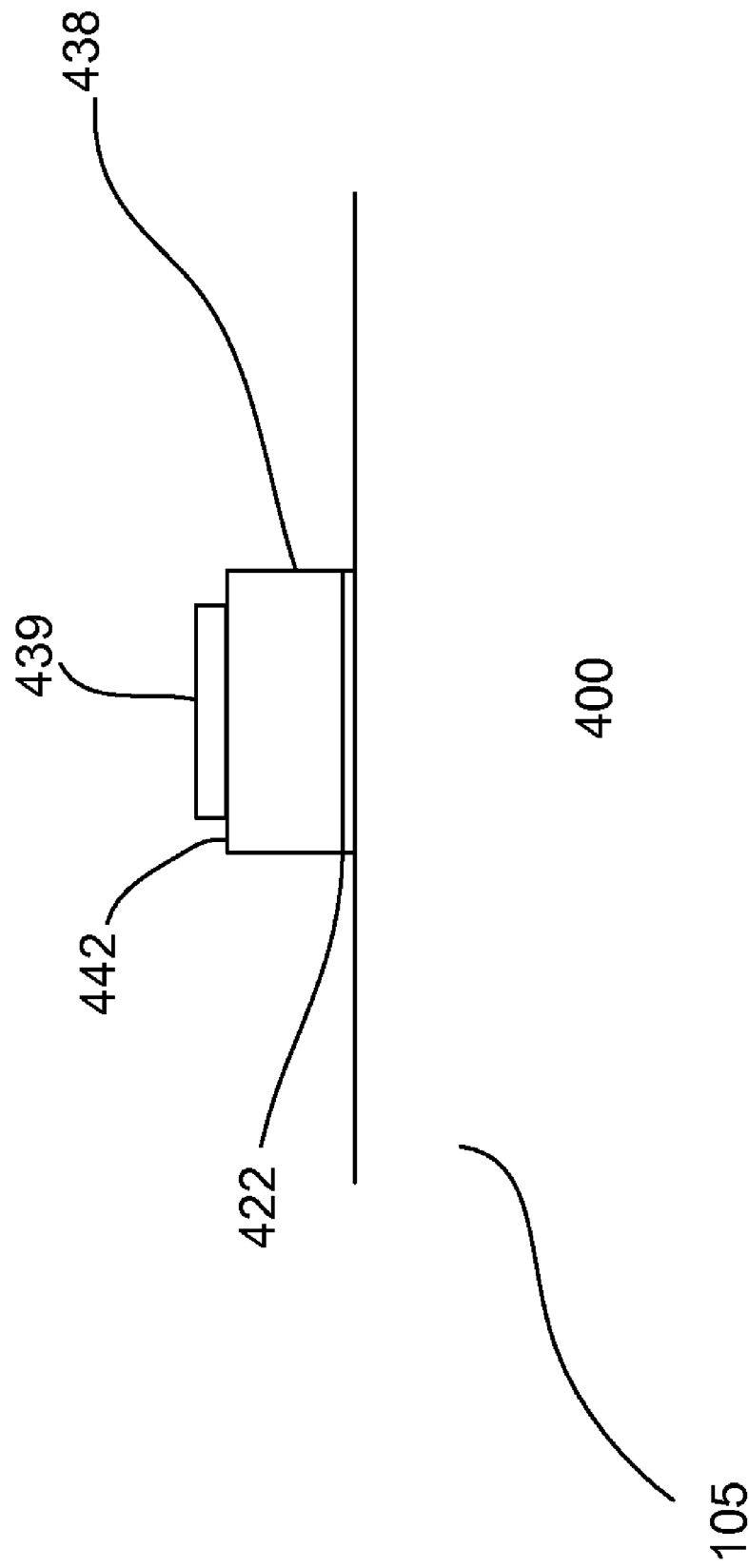

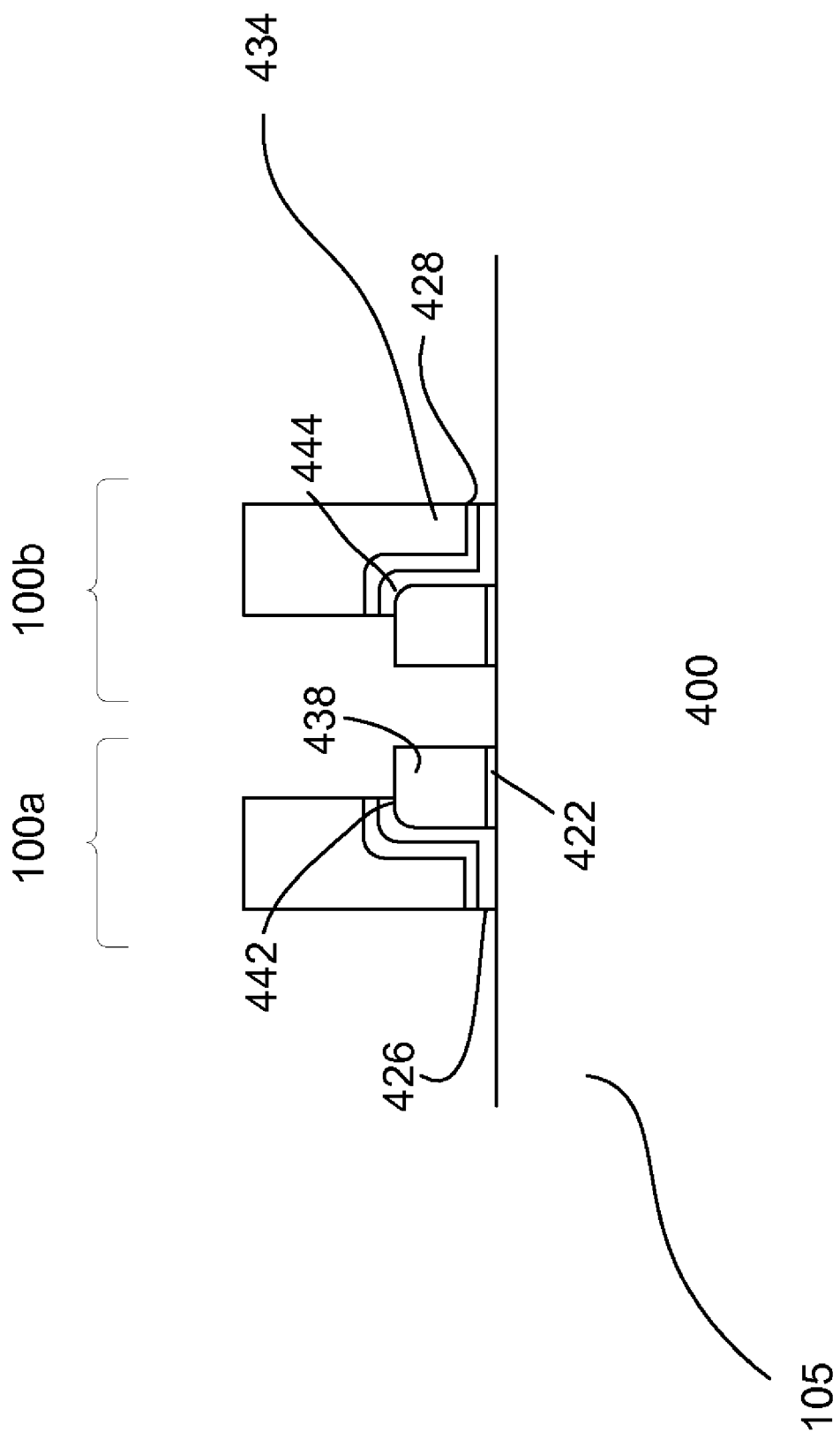

RELIABLE MEMORY CELL

BACKGROUND

Non-volatile memory (NVM) circuits have achieved widespread adoption for code and data storage applications. An important aspect of NVM circuits is their performance, which includes endurance (number of programming or write/erase cycles) and data retention after write/erase cycling. Within the industry, the performance of NVM technology has been characterized extensively. Generally, the NVM circuits should be able to endure over 100 thousand to 1 million programming cycles with data retention exceeding 20 years, even at extreme ambient temperatures.

Programming the memory to a program state involves, for example, injecting hot electrons into the gate dielectric of the floating or select gate of the memory cell, while erasing involves discharging the gate dielectric by Fowler-Nordheim (FN) tunneling. This may result in high electric fields, which can degrade the gate dielectric and cause reduced reliability of the device.

SUMMARY

A method of forming a semiconductor device is presented. The method includes providing a substrate prepared with a second gate. The second gate is processed to form a second gate with a rounded corner and a first gate is formed on the substrate. The first gate is adjacent to and overlaps a portion of the second gate and the rounded corner.

In another embodiment, a method of forming a memory cell is disclosed. The method includes providing a substrate prepared with a second gate of the memory cell. The second gate includes an overlap region. The second gate is processed to round a corner of the second gate in the overlap region. An inter-gate dielectric layer is formed in the overlap region and a first gate region of the substrate. The method further includes forming a first gate. The first gate overlaps the second gate in the overlap region and is disposed on the inter-gate dielectric layer adjacent to the second gate in the first gate region of the substrate.

A semiconductor device is presented in one embodiment. The semiconductor device includes a substrate. A first gate and a second gate are disposed on the substrate; the first gate overlaps the second gate. An inter-gate dielectric layer separates the first and second gates. A corner of the second gate which is overlapped by the first gate comprises a rounded corner.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 4a-f show an embodiment of a process for forming a memory cell.

DETAILED DESCRIPTION

Embodiments generally relate to semiconductor devices. More particularly, some embodiments relate to memory devices, such as non-volatile memory devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs).

Figure 1:
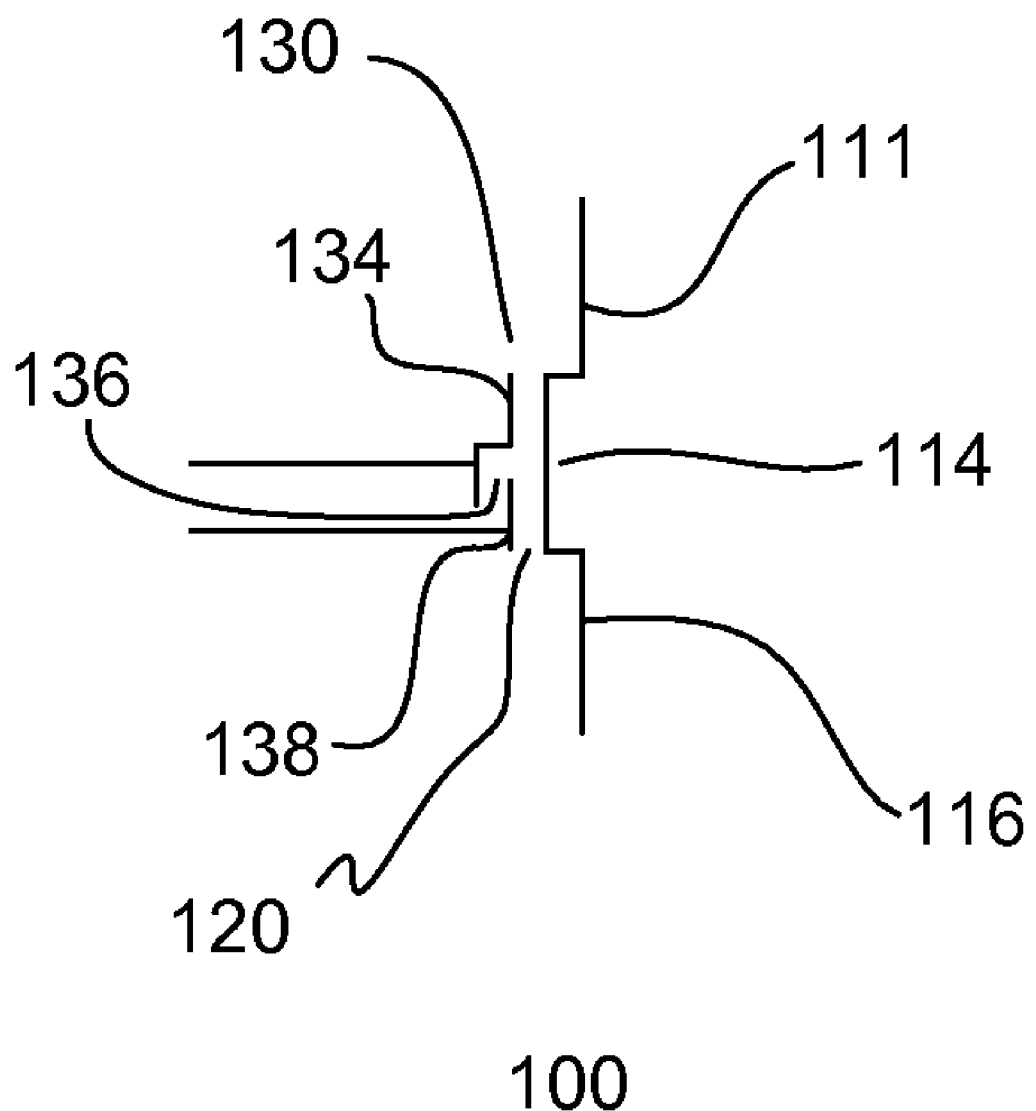
FIG. 1 shows an embodiment of a memory cell.

FIG. 1 shows a schematic diagram of an embodiment of a memory cell 100. The memory cell, in one embodiment, comprises a non-volatile memory cell. The memory cell comprises a transistor with a gate 130 over a channel 114 and between first and second terminals 111 and 116. The gate comprises a split gate having a first gate 134 and a second gate 138. In one embodiment, the first gate comprises a control gate, the first terminal comprises a source terminal, the second gate comprises a select gate and the second terminal comprises a drain terminal. Other configurations of gates and terminals are also useful. For example, the first gate can be a select gate, the first terminal can be a drain terminal, the second gate can be a control gate and the second terminal can be a source terminal.

In one embodiment, the first gate is adjacent to and partially overlaps the second gate. For example, the control gate is adjacent to and partially overlaps the select gate. In one embodiment, a portion of the control gate is disposed over the channel region and partially overlaps the select gate in an overlap region 136. A dielectric layer or layers 120 isolate the gates from each other and the channel.

The control gate is coupled to a control gate voltage source ($V_{cg}$), the select gate is coupled to a select gate voltage source ($V_{sg}$), the source terminal is coupled to a source voltage source ($V_s$), and the drain is coupled to a drain voltage source ($V_d$). For example, $V_{cg}$ can be about 0-14 V or about 8-9.5V, $V_{sg}$ can be about 0-3V or about 1-1.5V, $V_d$ can be about 0-7.5V or about 0-3V and $V_s$ can be about 0-5V or about 0-0.5V. Other voltage values can be supplied to the memory cell, for example, depending on the technology. The appropriate voltages are supplied to the memory cell to access the memory cell, such as programming and reading.

In accordance with one embodiment, a corner of the second gate in the overlap region comprises a rounded corner. Rounding the corners of the second gate has been found to reduce the magnitude of the electric field during programming/erasing (P/E) of the memory cell. By reducing the electric field, gate dielectric performance or reliability is improved.

Figure 2:
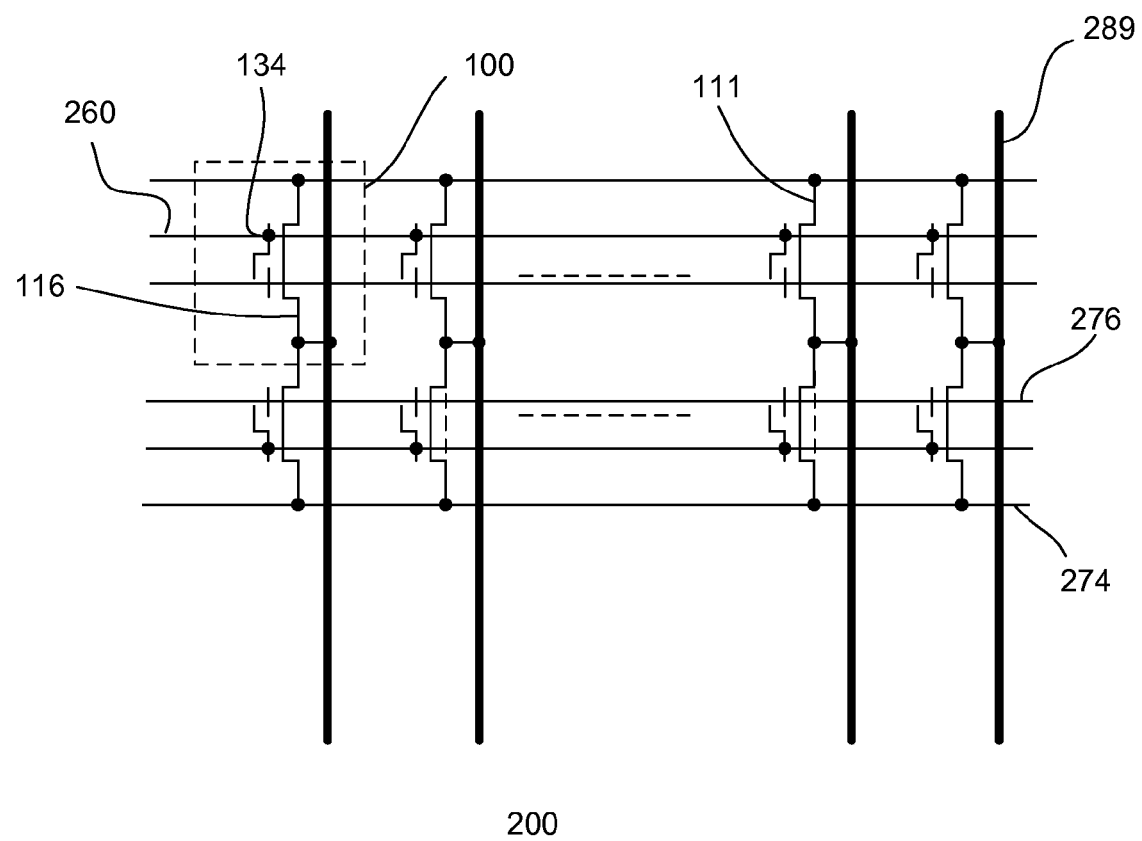
FIG. 2 shows an embodiment of a memory array.

FIG. 2 shows an embodiment of a memory array 200. In one embodiment, the memory array comprises a non-volatile memory array. The memory array comprises a plurality of memory cells arranged in rows and columns. The memory cells, for example, comprise memory cells 100 as described in FIG. 1. A row corresponds to, for example, a wordline (WL) 260 and a column corresponds to a bitline (BL) 289 of the array. In one embodiment, the BLs are coupled to the second or drain terminals 116 while WLs are coupled to the first or control gates 134 of the memory cells. For example, WLs provide $V_{cg}$, BLs provide $V_d$. Source lines (SLs) 274 may be employed to provide $V_s$ to the first or source terminals 111; select gate lines or SGLs 276 may be used to provide $V_{sg}$ to the second or select gates 138 of the memory cells. SLs and SGLs maybe coupled to the memory cells as desired. The memory cells may be configured as a NOR type array architecture. Arranging the memory cells in other types of array architectures, such as NAND, is also useful.

Figure 3:
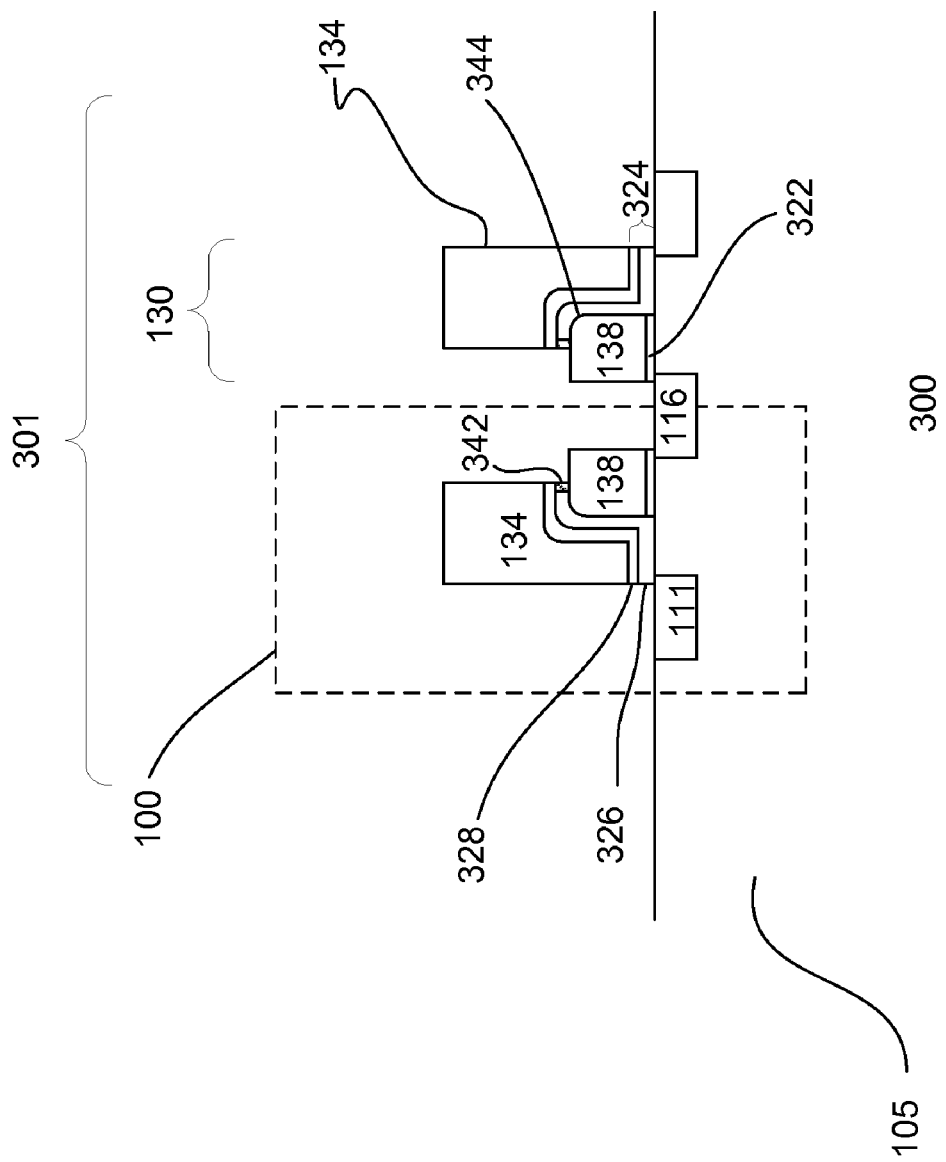
FIG. 3 shows a cross-sectional view of an embodiment of a memory cell.

FIG. 3 shows a portion 300 of an embodiment of a device or IC. As shown, the portion includes a substrate 105. The substrate, for example, comprises a silicon substrate. The substrate can be lightly doped with p-type dopants. Other types of substrates, such as silicon germanium or silicon-on-insulator (SOI), are also useful.

The substrate can be prepared with a region 301 containing memory cells 100. In one embodiment, the memory cells comprise non-volatile memory cells. Other types of memory cells are also useful. The region can be referred to as an array region. The array region shows adjacent memory cells. Although only two memory cells are shown, it is understood that many more memory cells are included in the device. The array region can be arranged to have sub-regions corresponding to, for example, groups of memory cells. The array region comprises heavily doped well or wells (not shown) with dopants of a first polarity type. The first polarity type can be n-type or p-type, depending on the memory cell type. The first polarity type wells are used for second polarity type memory cells. For example, n-type wells are used for p-type memory cells while p-type wells are used for n-type memory cells. P-type dopants can include boron (B), aluminum (Al) or a combination thereof while n-type dopants can include phosphorus (P), arsenic (As), antimony (Sb) or a combination thereof.

Additionally, the substrate may include non-array regions (not shown), such as logic portion for support circuitry. The substrate may also include other regions for other types of circuitry, depending on the type of device or IC. The logic portion, for example, can include low voltage (LV), high voltage (HV) and dual gate oxide (DGO) devices. The DGO devices, for example, are used for I/O circuitries.

The substrate includes isolation regions (not shown) to isolate active device regions from other active device regions, as required. The isolation regions, for example, comprise shallow trench isolation (STI) regions. Other types of isolation regions are also useful.

In one embodiment, a memory cell comprises a transistor with a gate 130 between first and second terminals 111 and 116 formed by, for example diffusion regions. The first terminal, for example, serves as a source and the second terminal serves as a drain. The source and drain comprise, for example, second polarity type dopants.

The gate, in one embodiment, comprises a split gate with first and second gates 134 and 138. For example, the first gate can be a control gate and the second gate can be a select gate. In one embodiment, the first gate is adjacent to and overlaps the second gate in an overlap region. In one embodiment, the first gate is adjacent to and overlaps a portion of the second gate in the overlap region, leaving a portion of the second gate uncovered by the first gate in a non-overlap region. The adjacent portion of the first gate is over the first gate region of the substrate.

The gates are isolated from each other and the substrate by a dielectric layer. In one embodiment, the dielectric layer comprises a plurality of dielectric layers. For example, the dielectric layer comprises a second gate dielectric layer 322 and an inter-gate dielectric layer 324 provided to separate the first gate from the second gate and substrate. The second gate dielectric layer, for example, is a LV gate dielectric layer. Other types of second gate dielectric layers may also be employed.

In one embodiment, the inter-gate dielectric comprises a first and second inter-gate dielectric layers 326 and 328. The first inter-gate dielectric layer contacts the second gate and substrate while the second inter-gate layer is disposed thereon. In one embodiment, the first inter-gate dielectric layer comprises silicon oxide while the second inter-gate dielectric layer comprises silicon oxide with silicon nano-crystals. Other types of configurations of the inter-gate dielectric layers are also useful. For example, the first inter-gate dielectric layer can comprise a high-K dielectric material and/or other types of nano-crystals.

An anti-reflective coating (ARC) 342, such as silicon nitride, may be provided on the second gate. In one embodiment, the ARC is at least partially pulled back from the edge of the second gate which is overlapped by the first gate. Pulling back the ARC exposes at least a portion of the top surface of the second gate in the overlap region. In one embodiment, at least a portion of the top surface of the second gate is exposed sufficiently for rounding the corner of the second gate in the overlap region. For example, at least about 5-50% of the total gate length is exposed for rounding the corner of the second gate in the overlap region. Pulling back the ARC layer to expose the top surface of the second gate by other amounts is also useful. In alternative embodiments, the ARC is completely removed from the overlap region. The ARC can be completely removed prior or subsequent to rounding the corner of the second gate in the overlap region.

In one embodiment, at least an upper corner 344 of the second gate in the overlap region which is adjacent to or surrounded by the first gate is rounded. The corner is rounded to reduce the electric field on the inter-gate dielectric layer. In one embodiment, the radius of the rounded corner is about 1-100 nm. Rounding the corner by other amounts may also be useful.

Electric field on the inter-gate dielectric layer for devices with second gates of rounded corners has been found to be reduced, for example, during P/E of the memory cells as compared to those with second gates of unrounded corners. The electric field is reduced whether or not the ARC remains in the overlap region between the first and second gates. By reducing the electric field, improved device reliability is achieved.

The first gate, for example, may be a gate conductor which serves as a common gate for a row of memory cells. Adjacent memory cells can be configured as mirror gate electrodes which may share a common diffusion region. Other configurations or layouts of memory cells are also useful. The gates may also be provided with sidewall spacers and salicide contacts (not shown).

Figure 4A:
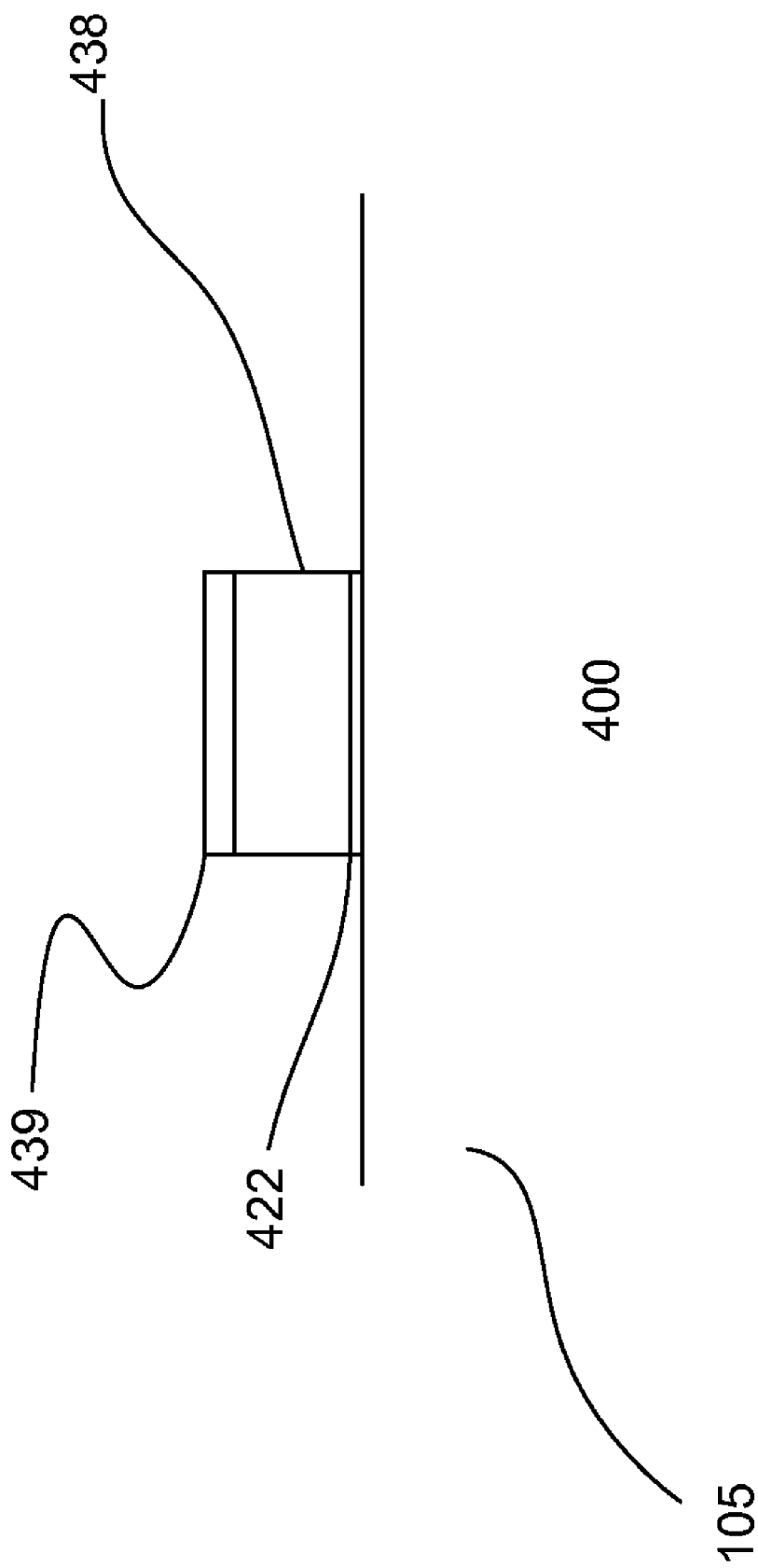

FIGS. 4a-f show cross-sectional views of an embodiment of a process for forming a device or IC 400. Referring to FIG. 4a, a substrate 105 is provided. The substrate can comprise a silicon substrate, such as a lightly p-type doped substrate. Other types of substrates, including silicon germanium or silicon-on-insulator (SOI), are also useful.

The substrate is prepared with an array region containing memory cells. In one embodiment, the memory cells comprise non-volatile memory cells. Other types of memory cells are also useful. The array region comprises heavily doped well or wells (not shown) with dopants of a first polarity type. The first polarity type can be n-type or p-type, depending on the memory cell type. The first polarity type wells are used for second polarity type memory cells. For example, n-type wells are used for p-type memory cells while p-type wells are used for n-type memory cells. P-type dopants can include boron (B), aluminum (Al) or a combination thereof while n-type dopants can include phosphorus (P), arsenic (As), antimony (Sb) or a combination thereof.

Additionally, the substrate may include a logic portion (not shown) for support circuitry. The substrate may also include regions for other types of circuitry, depending on the type of device or IC.

Generally, the IC includes regions with both first and second type wells. To form the doped wells, ion implantation techniques, such as implantation with a mask, can be used. The first and second type wells can be formed in separate processes. Other techniques for forming the active regions are also useful.

The substrate can be prepared with isolation regions (not shown), for example, to separate the active regions from each other and other active device regions. In one embodiment, the isolation regions comprise STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

Various layers of the second gate are formed on the substrate. The second gate, for example, serves as the select gate. Alternatively, the second gate may serve as the control gate. In one embodiment, a second gate dielectric layer 422 is formed on the substrate. The gate dielectric layer, in one embodiment, comprises silicon oxide. Other types of gate dielectric layers, such as silicon oxynitride, may also be used. Various techniques can be employed to form the gate dielectric layer. For example, the gate dielectric layer can be formed by thermal oxidation in either a wet or dry ambient. The oxidation can be performed at a temperature range of about 750-1100° C. with a pressure range of about 0-760 T. In an alternative embodiment, the oxidizing ambient can be provided with nitrogen. The thickness of the second gate dielectric layer is about 10 to 100 Å. The second gate dielectric layer can be formed using other types of dielectric materials, thicknesses or techniques.

A second gate electrode layer 438 is deposited on the second gate dielectric layer. The gate electrode layer comprises, in one embodiment, polysilicon. The gate electrode layer can be formed as an amorphous or non-amorphous layer. Alternatively, other types of gate electrodes can be used. The thickness of the second gate electrode layer, for example, is about 400-2000 Å. Other thicknesses are also useful. To form the second gate electrode layer, techniques, such as chemical vapor deposition (CVD), can be used. Other techniques are also useful.

In one embodiment, the gate electrode layer comprises a doped gate electrode layer. For example, the gate electrode layer comprises n-type dopants having a concentration of about 1-9E15 ion/cm$^2$. Other types of dopants and concentrations are also useful. The dopants, for example, are incorporated into the gate electrode layer by ion implantation. Other techniques, such as insitu-doping, can be used for incorporating the dopants. Providing undoped gate electrode layers may also be useful.

The various second gate layers are patterned. In one embodiment, the various layers are patterned to form a dual gate stack. Techniques, such as mask and etch, can be used to form the dual gate stack. For example, a photoresist layer is formed over the gate layers and patterned, exposing portions of the gate layers. An anisotropic etch, such as a reactive ion etch (RIE), is performed to remove exposed portions of the gate layers.

In one embodiment, an ARC layer 439 is formed on top of the second gate electrode layer below the photoresist layer. The ARC layer improves lithographic resolution. The ARC layer, for example, comprises silicon nitride or silicon oxide. Other types of ARC layers are also useful. The thickness of the ARC layer is, for example, about 10-500 Å. After patterning, the photoresist layer is removed, leaving the ARC layer over the gate stack.

In one embodiment, as shown FIG. 4b, at least portions 442 of the top surface of the dual gate stack from the edges are exposed. In one embodiment, at least portions of the top surface of the dual gate stack are exposed to facilitate rounding the corners of the dual gate stack in a subsequent process. In one embodiment, exposing portions of the top surface of the dual gate stack is achieved by pulling back the ARC layer. The ARC layer can be pulled back about 5-50% of the total gate length. Pulling the ARC layer by other amounts may also be useful. To pull back the ARC layer, a wet etch is employed. In one embodiment, the wet etch comprises a HF chemistry and is performed at a temperature range of about 25-100° C. The duration of the wet etch is about 1-120 sec. Other types of processes or etch chemistry can also be used. For example, in another embodiment, a wet etch employing phosphoric acid is used. The phosphoric acid etch can be performed at a temperature of about 40-200° C., for about 1-60 sec.

Although the ARC layer is pulled back, it remains over a portion of the second gate electrode. The ARC layer remains in the overlap region between the first and second gate electrodes as discussed previously. The ARC layer, for example, improves the poly-to-poly breakdown margin during erasing and prevents the consumption of nano-crystal oxide stack in between the first and second gates during downstream processing, such as a wet etch. This may improve reliability and yield. In alternative embodiments, the ARC layer may be removed to expose the top surface of the dual gate stack.

Figure 4C:
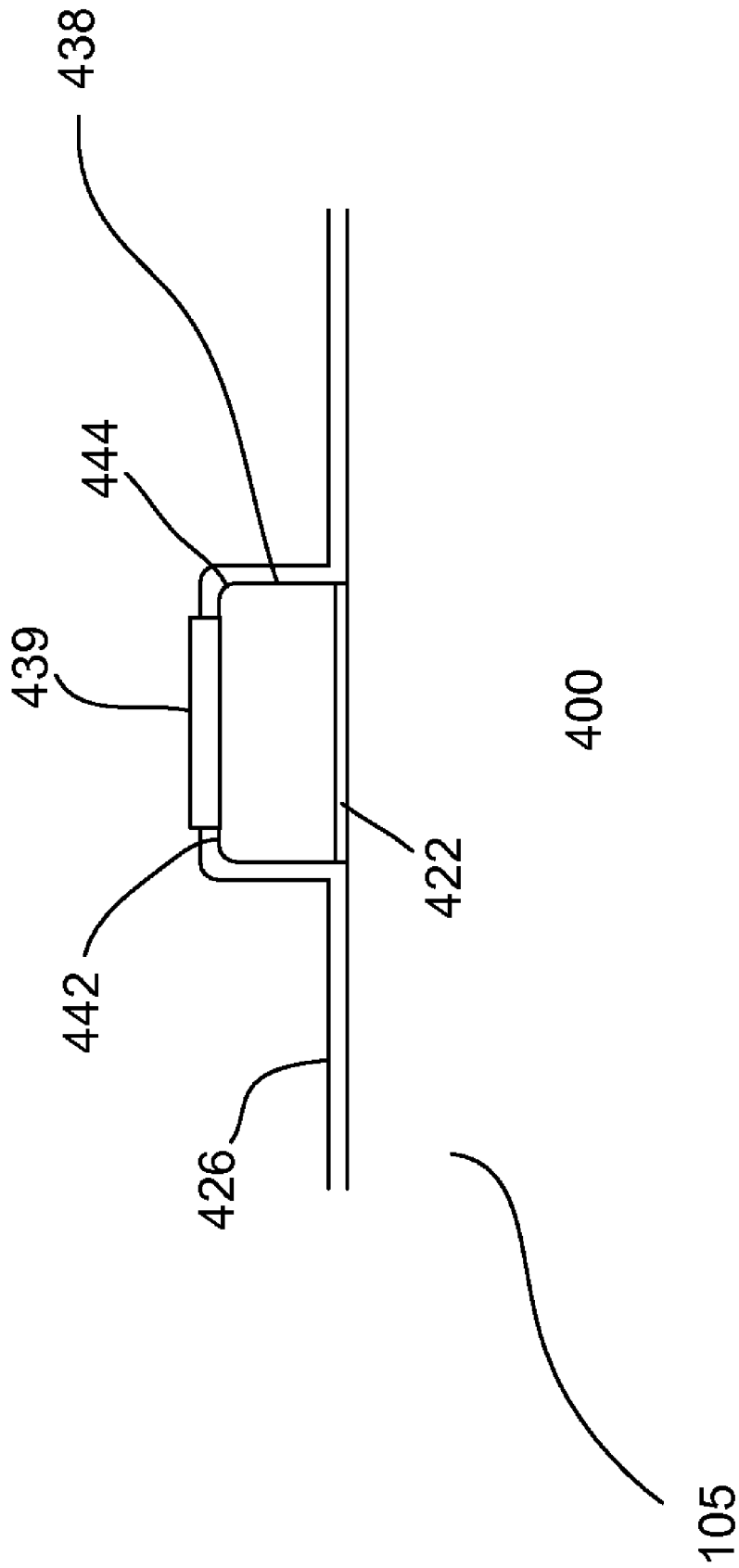

Referring to FIG. 4c, an inter-gate dielectric layer is formed. Forming the inter-gate dielectric layer, in one embodiment, comprises forming the first and second inter-gate dielectric layers. In one embodiment, in forming the first inter-gate dielectric layer 426, the exposed corners 444 of the dual gate stack are rounded. The first inter-gate dielectric layer may be selectively formed on the substrate and portions of the dual gate stack exposed by the ARC layer. Other techniques for forming the inter-gate dielectric layer may also be useful. The inter-gate dielectric layer is formed by, for example, oxidation. In one embodiment, the inter-gate dielectric layer is formed by insitu steam generated (ISSG) oxidation. The oxidation pressure can range from about 0 to 50 T, while the oxidation temperature can range from about 600 to 1000° C. in a hydrogen ambient. Other techniques for rounding the corners of the dual gate stack are also useful. The thickness of the inter-gate dielectric layer is about, for example, less than or equal to 200 Å. Other thicknesses may also be useful.

Prior to forming the inter-gate dielectric layer, a pre-amorphization implant (PAI) may be performed. The PAI facilitates forming a thicker first inter-gate dielectric layer. In one embodiment, the PAI comprises neutral species of dopants such as Ge, Si and C. Other types of dopants may also be used.

In an alternative embodiment, the exposed corners of the dual gate stack are rounded prior to forming the first inter-gate dielectric layer. In one embodiment, the exposed corners of the dual gate stack are rounded by a hydrogen anneal. For example, the hydrogen anneal is performed prior to forming the first inter-gate dielectric layer. Other types of processes for rounding the exposed corners are also useful. The conditions of the anneal comprise, for example, a pressure ranging from about 0 to 500 T and a temperature ranging from about 800 to 1200° C. The hydrogen anneal rounds the corners with improved polysilicon surface quality. After the corners are rounded, the process continues to form the first inter-gate dielectric layer. For example, the first inter-gate dielectric layer can be formed by thermal oxidation. ISSG and/or PAI may also be employed to form the first inter-gate dielectric layer.

Figure 4D:
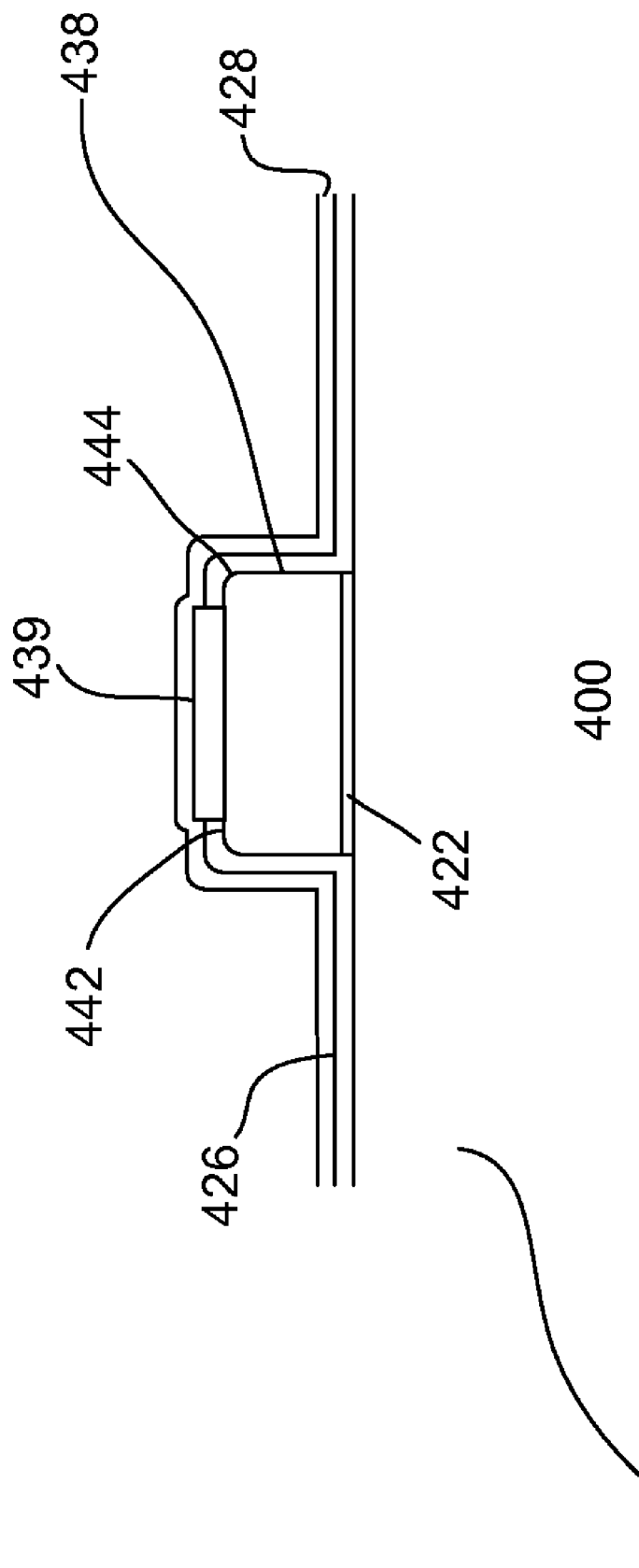

As shown in FIG. 4d, a second inter-gate dielectric layer 428 is deposited on the substrate. The second inter-gate dielectric layer may cover the first inter-gate dielectric layer as well as the ARC layer. In one embodiment, the second inter-gate dielectric layer comprises silicon oxide with silicon nano-crystals. Providing the inter-gate dielectric layer with other types of nano-crystals, such as germanium nano-crystals may also be useful.

Various techniques can be employed to form the inter-gate dielectric layer. In one embodiment, a silicon layer is formed on the substrate. The silicon layer may be an amorphous or polysilicon layer. The silicon layer can be about 10-300 Å. Other thicknesses are also useful. The silicon layer is formed by, for example, CVD at a temperature of about 500-800° C. The substrate is being annealed after forming the silicon layer to form Si nano-crystals. The anneal, for example, is performed at a temperature of 700-1000° C. and pressure of about 0-50 T for about 1-200 sec in a nitrogen ambient. After forming the nanocrystals, thermal oxidation is performed to form a silicon dioxide layer of, for example, about 10-500 Å. For example, the substrate is oxidized at a temperature of about 500-1000° C. for about 100-1000 sec. A final anneal can be performed after forming the silicon dioxide layer. The final anneal can be performed in, for example, a nitrogen and/or oxygen ambient at a temperature of about 500-1100° C. under a pressure of about 0-760 T for about 10-5000 sec. The final anneal may comprise a plurality of anneal processes.

Figure 4E:
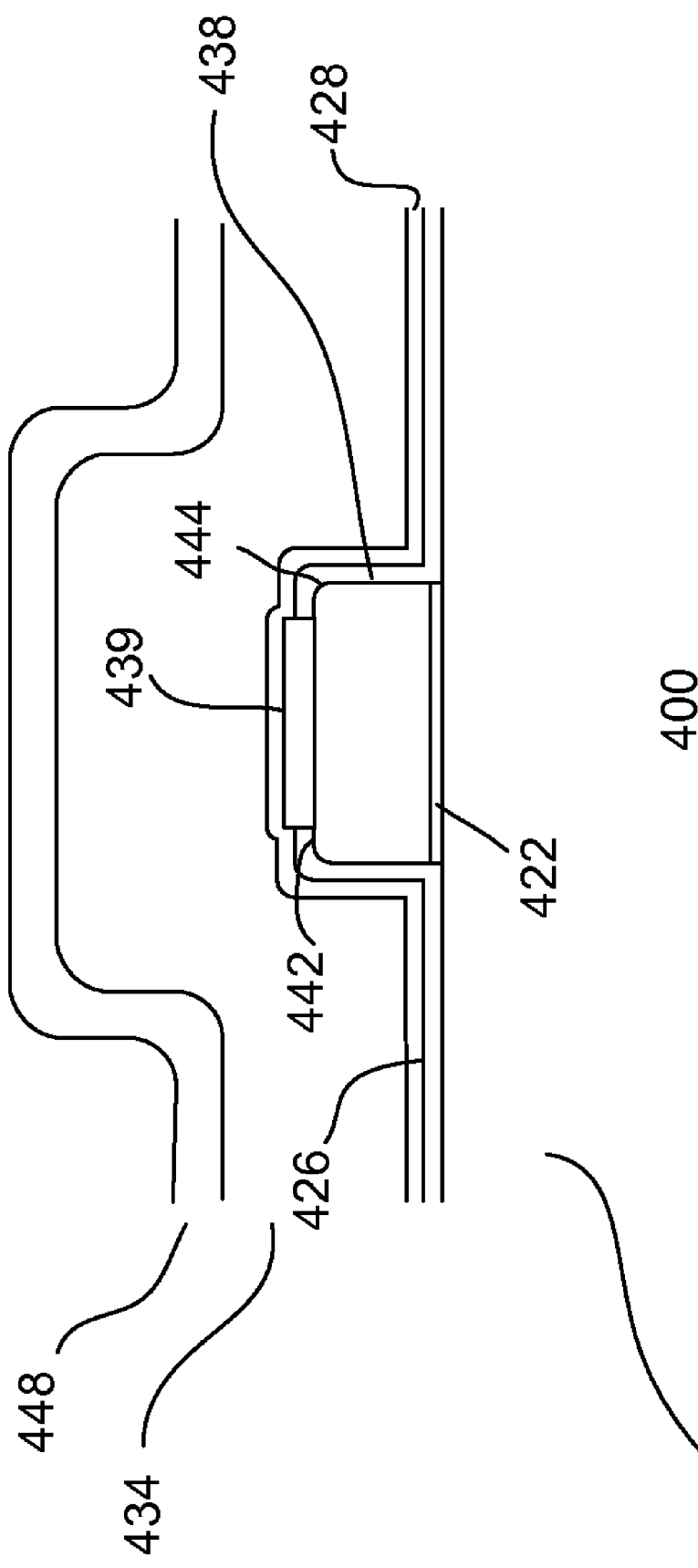

After forming the second inter-gate dielectric layer, the first gate electrode layer 434 is deposited on the substrate, as shown in FIG. 4e. The first gate electrode layer, in one embodiment, comprises a conformal layer of polysilicon. The gate electrode layer can be formed as an amorphous or non-amorphous layer. The gate electrode layer, in one embodiment, comprises a doped gate electrode layer. For example, the gate electrode layer can be doped with n-type dopants, such as phosphorus, at a concentration of about 1-9E15 ions/cm². The dopants can be incorporated by ion implantation. Other techniques for incorporating the dopants can also be employed. Forming the gate electrode with other types of gate electrode materials may also be useful. In one embodiment, the first gate electrode comprises a thickness which is greater than the second gate. Typically, the thickness of the first gate electrode layer is about 400-2000 Å. Other thicknesses may also be useful. To form the first gate electrode layer, techniques, such as chemical vapor deposition (CVD), can be used. Other techniques are also useful.

As shown, an ARC layer 448 is formed over the first gate electrode layer. The ARC, for example, comprises silicon nitride or oxide. Other types of ARC layers are also useful. The thickness of the ARC layer is, for example, about 10-500 Å. The ARC layer serves to improve lithographic resolution.

Referring to FIG. 4f, the substrate is patterned to form adjacent memory cells 100a-b from the dual gate stack. Techniques, such as mask and etch, can be used to pattern the substrate. For example, a photoresist layer is formed over the ARC layer. The photoresist layer can be selectively patterned by lithographic techniques. The pattern of the photoresist can be transferred to the ARC and gate electrode layers by, for example, an anisotropic etch such as RIE. The various layers beneath the photoresist can be patterned to form the memory cells. The photoresist layer is removed after forming the memory cells.

In one embodiment, the memory cells can be formed with two patterning processes. For example, a first patterning process patterns a portion of the first and second gates followed by a second patterning process to pattern the first gate. In patterning the first gate, depending on the overlay, the ARC layer over the second gate may or may not be removed. Forming the memory cells with other patterning processes or configurations is also useful.

The process continues to form the IC. For example, additional processing can include removing of the ARC layer over the first gate, forming gate sidewall spacers, source/drain diffusion regions and salicide contacts, filling gaps with dielectric material, forming one or more interconnect levels, final passivation, dicing, assembly and packaging. Other processes are also useful. For example, other components, such as LV, HV and I/O devices can be formed prior to forming the interconnections. The memory cells can be formed as a memory device or embedded into a part of ICs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device comprising:
   providing a substrate prepared with a second gate;
   processing the second gate to form a second gate with a rounded corner; and
   forming a first gate on the substrate, wherein the first gate is adjacent to and partially overlaps a portion of the second gate in the rounded corner part of the second gate.

2. The method of claim 1 wherein processing the second gate to form a second gate with a rounded corner comprises performing a hydrogen anneal.

3. The method of claim 1 further comprises a first diffusion region adjacent to the first gate and a second diffusion region adjacent to the second gate.

4. The method of claim 3 wherein the first diffusion region serves as a source terminal and the second diffusion region serves as a drain terminal.

5. The method of claim 1 wherein the first gate comprises a control gate and the second gate comprises a select gate.

6. The method of claim 5 further comprises a first diffusion region adjacent to the first gate and a second diffusion region adjacent to the second gate.

7. The method of claim 6 wherein the first diffusion region serves as a source terminal and the second diffusion region serves as a drain terminal.

8. The method of claim 1 wherein processing the second gate comprises a hydrogen anneal to round the corner of the second gate in the overlap region.

9. The method of claim 8 further comprises forming an inter-gate dielectric layer in the overlap region of the second gate and between the first gate and the substrate.

10. The method of claim 9 wherein forming the inter-gate dielectric layer comprises forming an inter-gate dielectric layer with nano-crystals.

11. The method of claim 1 further comprises forming an inter-gate dielectric layer in the overlap region of the second gate and between the first gate and the substrate.

12. The method of claim 11 wherein the second gate comprises:
   a second gate dielectric layer;
   a second gate electrode;
   a device layer over the second gate electrode; and
   further comprises forming a dielectric layer on the substrate, the dielectric layer covering the second gate and substrate, wherein depositing the dielectric layer rounds the corner of the second gate in the overlap region.

13. The method of claim 12 comprises a preamorphization implant (PAI) prior to forming the dielectric layer.

14. The method of claim 13 wherein forming the dielectric layer comprises forming a dielectric layer with nano-crystals.

15. The method of claim 13 wherein forming the dielectric layer comprises forming a dielectric layer with silicon nano-crystals.

16. The method of claim 12 wherein forming the dielectric layer comprises thermal oxidation or insitu steam generated (ISSG) oxidation.

17. The method of claim 16 wherein forming the dielectric layer comprises forming a dielectric layer with nano-crystals.

18. The method of claim 16 comprises a preamorphization implant (PAI) prior to forming the dielectric layer.

19. The method of claim 18 wherein forming the dielectric layer comprises forming a dielectric layer with nano-crystals.

20. A method of forming a memory cell comprising:
   providing a substrate prepared with a second gate of the memory cell, wherein the second gate includes an overlap region;
   processing the second gate to round a corner of the second gate in the overlap region;
   forming an inter-gate dielectric layer in the overlap region and a first gate region of the substrate; and
   forming a first gate, wherein the first gate overlaps a portion of the second gate in the overlap region, leaving a portion of the second gate uncovered by the first gate in a non-overlap region, and the first gate is disposed on the inter-gate dielectric layer adjacent to the second gate in the first gate region of the substrate.

21. A semiconductor device comprising:
   a substrate;
   a second gate disposed on the substrate;
   a first gate disposed on the substrate and only partially overlapping the second gate; and
   an inter-gate dielectric layer separating the first and second gates,
   wherein a corner of the second gate which is overlapped by the first gate comprises a rounded corner.

22. The device of claim 21 wherein the first gate comprises a control gate and the second gate comprises a select gate.

23. The device of claim 21 wherein the dielectric layer comprises a dielectric layer with nano-crystals.

24. The device of claim 22 further comprises a first diffusion region adjacent to the first gate and a second diffusion region adjacent to the second gate.

25. The device of claim 24 wherein the first diffusion region serves as a source terminal and the second diffusion region serves as a drain terminal.

26. The device of claim 21 further comprises a first diffusion region adjacent to the first gate and a second diffusion region adjacent to the second gate.

27. The device of claim 26 wherein the first diffusion region serves as a source terminal and the second diffusion region serves as a drain terminal.

* * * * *